United States Patent [19]
Kuo

[11] Patent Number: 5,248,905
[45] Date of Patent: Sep. 28, 1993

[54] HIGH SPEED, MASTER/SLAVE LATCH TRANSCEIVER HAVING A DIRECTLY-DRIVEN SLAVE STAGE

[75] Inventor: James R. Kuo, Cupertino, Calif.

[73] Assignee: National Semiconductor Corporation, Santa Clara, Calif.

[21] Appl. No.: 635,734

[22] Filed: Dec. 28, 1990

[51] Int. Cl.⁵ .......................................... H03K 3/289
[52] U.S. Cl. ............................. 307/272.2; 307/446; 307/480
[58] Field of Search .................. 307/443, 272.1, 272.2, 307/446, 480

[56] References Cited

U.S. PATENT DOCUMENTS

| | | | |
|---|---|---|---|
| 3,603,815 | 9/1971 | Rao | 307/272.2 |
| 4,258,273 | 3/1981 | Straznicky et al. | 307/272.2 |
| 4,900,949 | 2/1990 | Saitoh | 307/272.2 |
| 5,017,808 | 5/1991 | Ueno et al. | 307/446 |

FOREIGN PATENT DOCUMENTS

| | | | |
|---|---|---|---|
| 0162718 | 11/1985 | European Pat. Off. | |
| 0225075 | 6/1987 | European Pat. Off. | |
| 0190711 | 10/1984 | Japan | 307/272.2 |
| 0158817 | 6/1989 | Japan | 307/272.2 |

OTHER PUBLICATIONS

Holt, "Electronic Circuits: Digital and Analog", John Wiley & Sons, New York, 1978, pp. 176–177.
Motorola Technical Developments; vol. 5, No. 1, Oct. 1985, Schaumburg, IL; pp. 54–55; Mark Bluhm; "A High Speed Output Buffer".
IBM Technical Disclosure Bulletin; vol. 33, No. 7, Dec. 1990, New York, US pp. 185–189, "Circuit Scheme to Improve Chip Data Hold Time".

Primary Examiner—Timothy P. Callahan
Attorney, Agent, or Firm—Limbach & Limbach

[57] ABSTRACT

A multi-bit latch transceiver is designed to meet the IEEE 1194.1 standard for backplane transceiver logic as specified in the IEEE 896.2 Futurebus+ specification. The latch transceiver features support for live insertion, low skew, controlled rise/fall time (2ns–5ns) and glitch free power-up/down protection. The transceiver utilizes on-chip latches and a built-in bandgap reference that provides very accurate thresholds. Unique slave stage logic in the transceiver's driver stage provides preset input conditions to the slave latch such that data is instantly clocked to the driver output when the driver is enabled, thus reducing propagation delay.

2 Claims, 20 Drawing Sheets

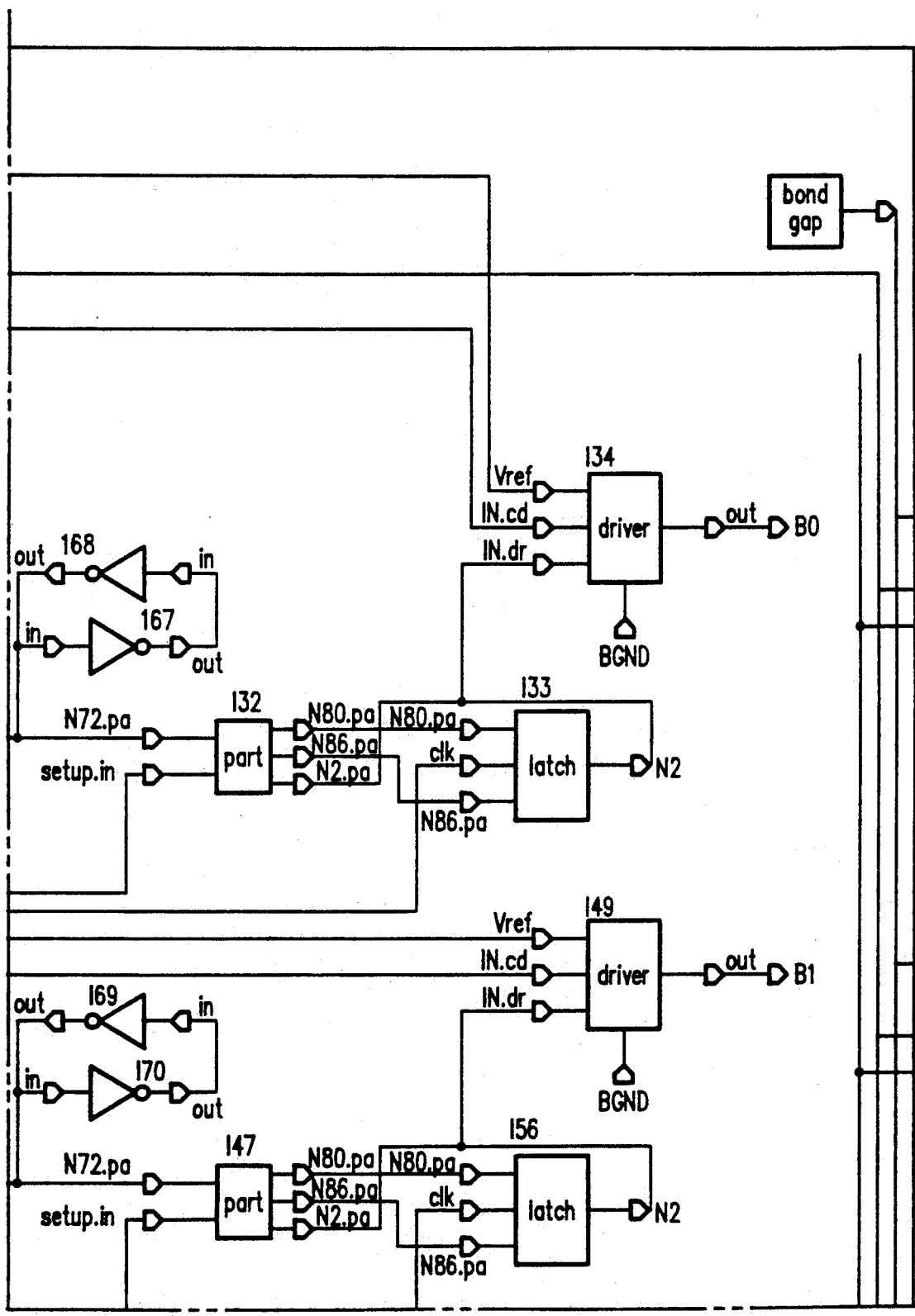
FIG. 4"

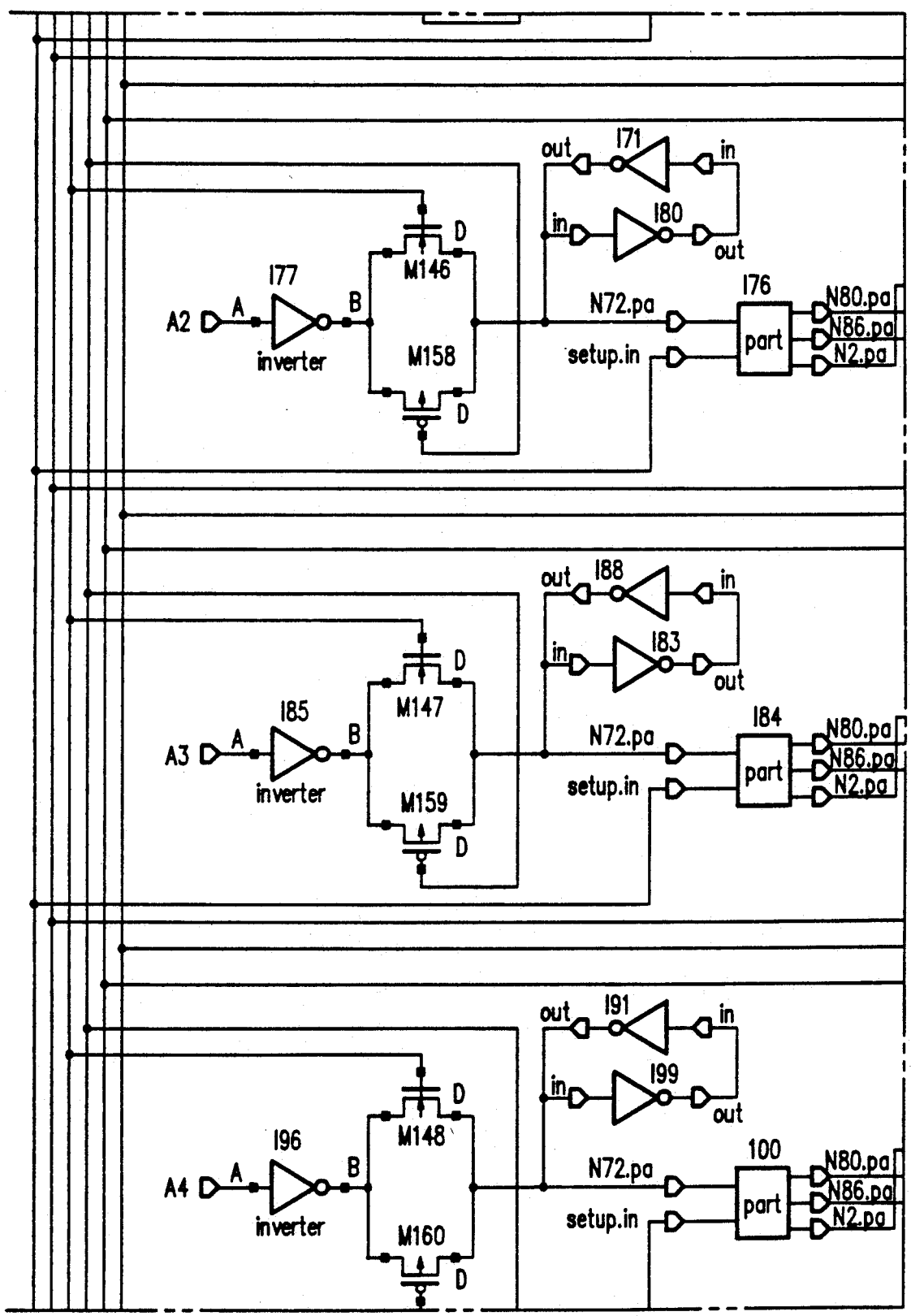
FIG. 4'''''

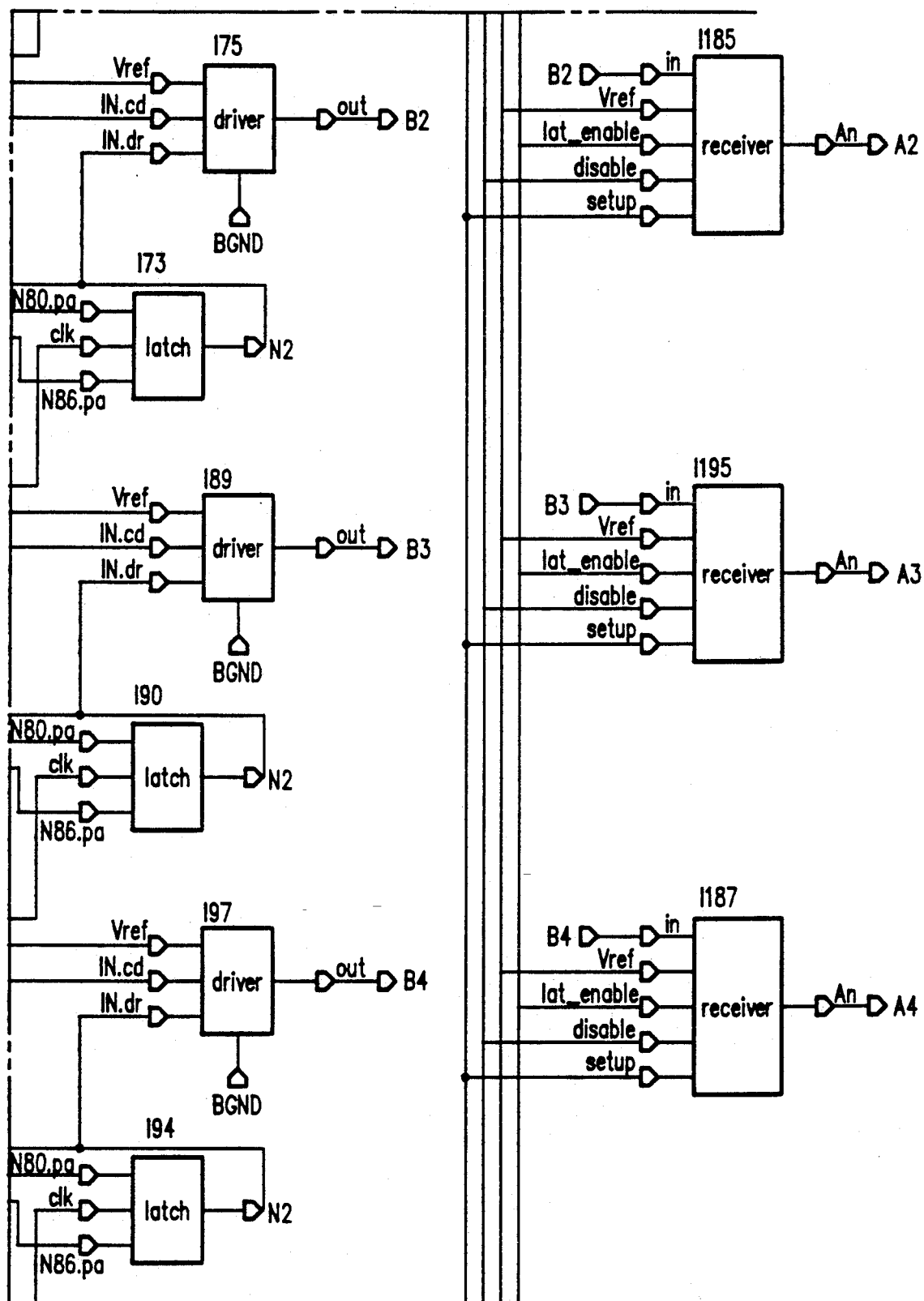
FIG. 4'''''

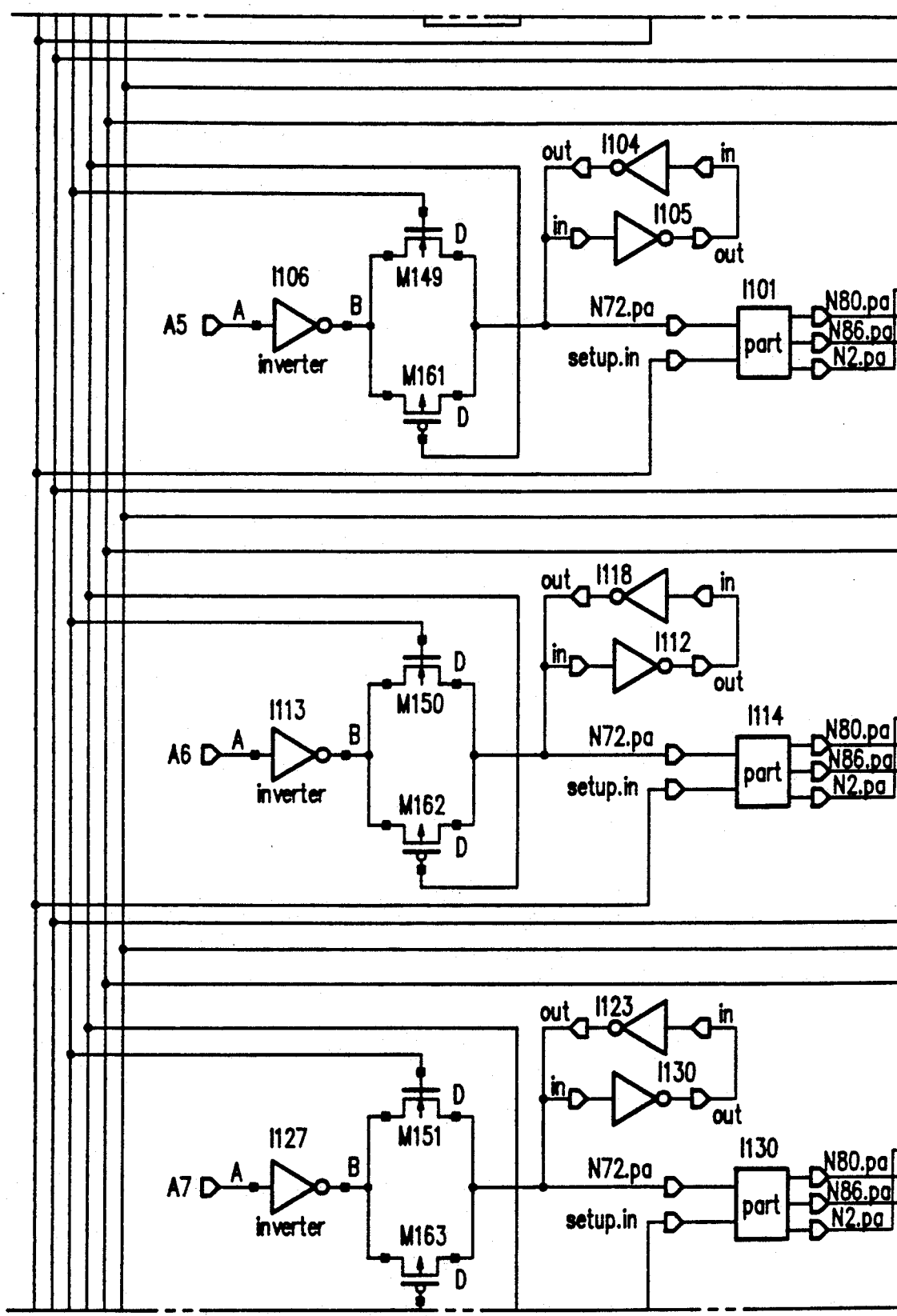
FIG. 4'''''

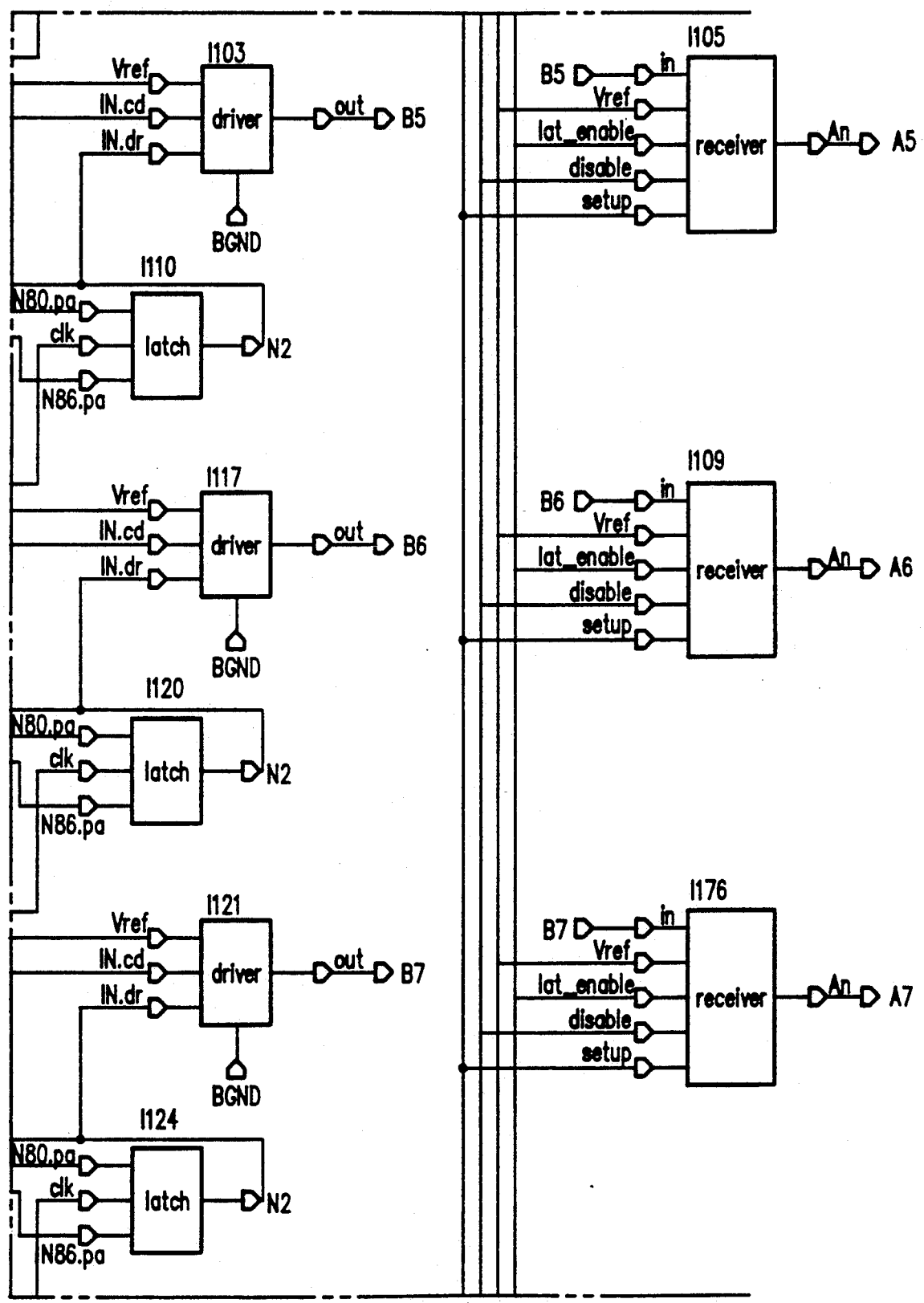
FIG. 4'''''''

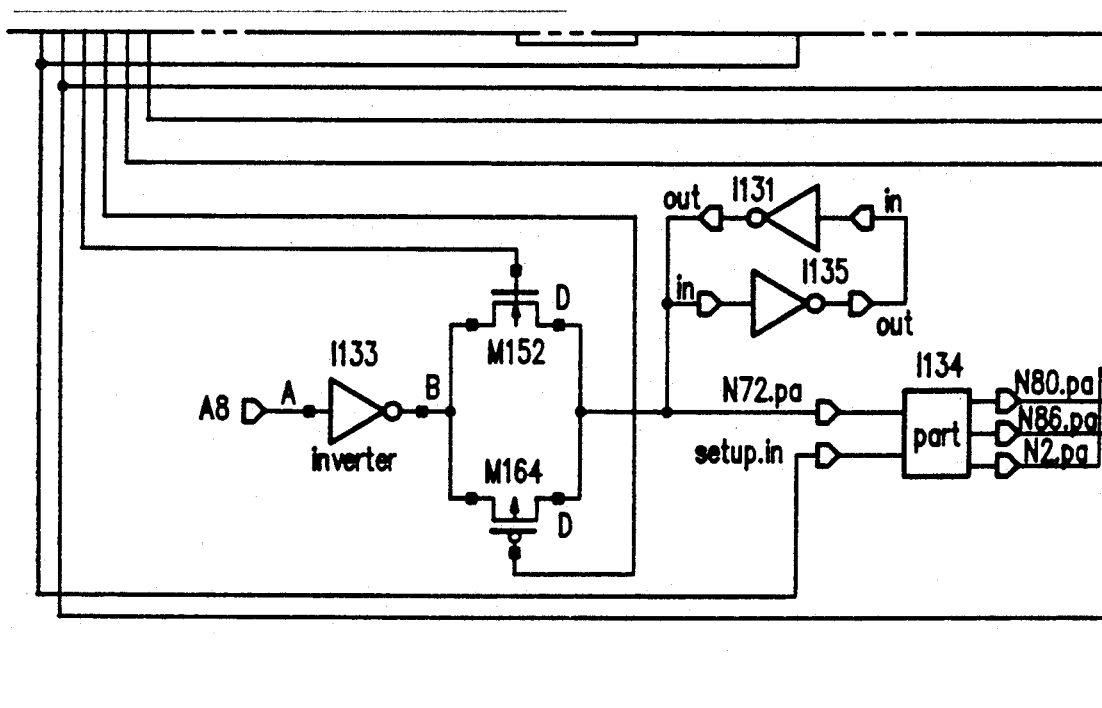
FIG. 4'''''''''

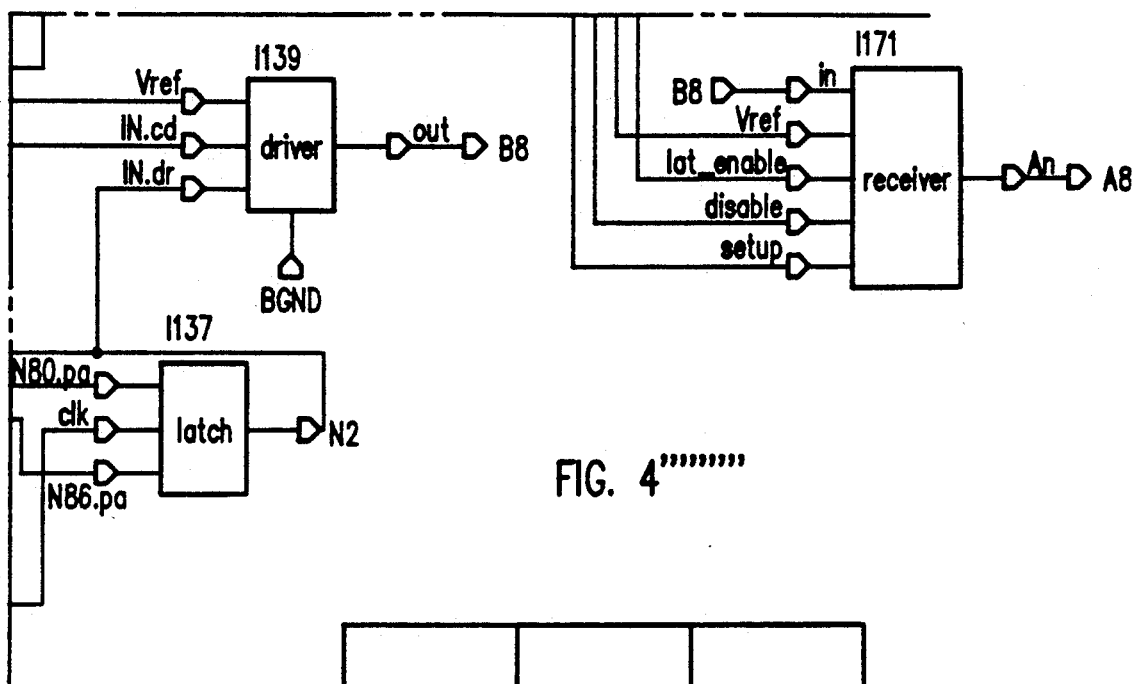
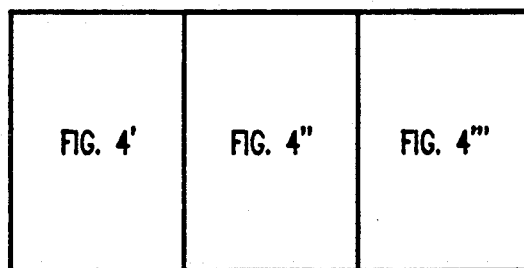
FIG. 4'''''''''
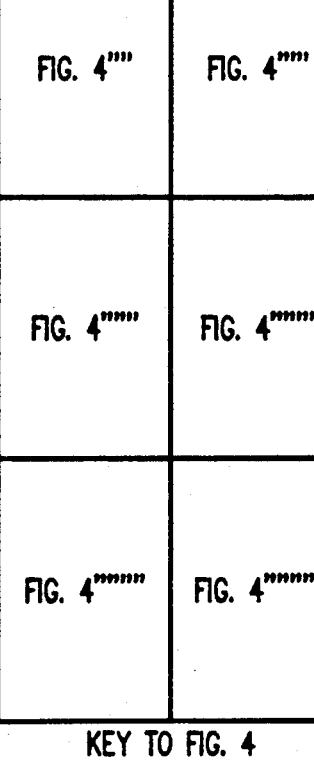
KEY TO FIG. 4

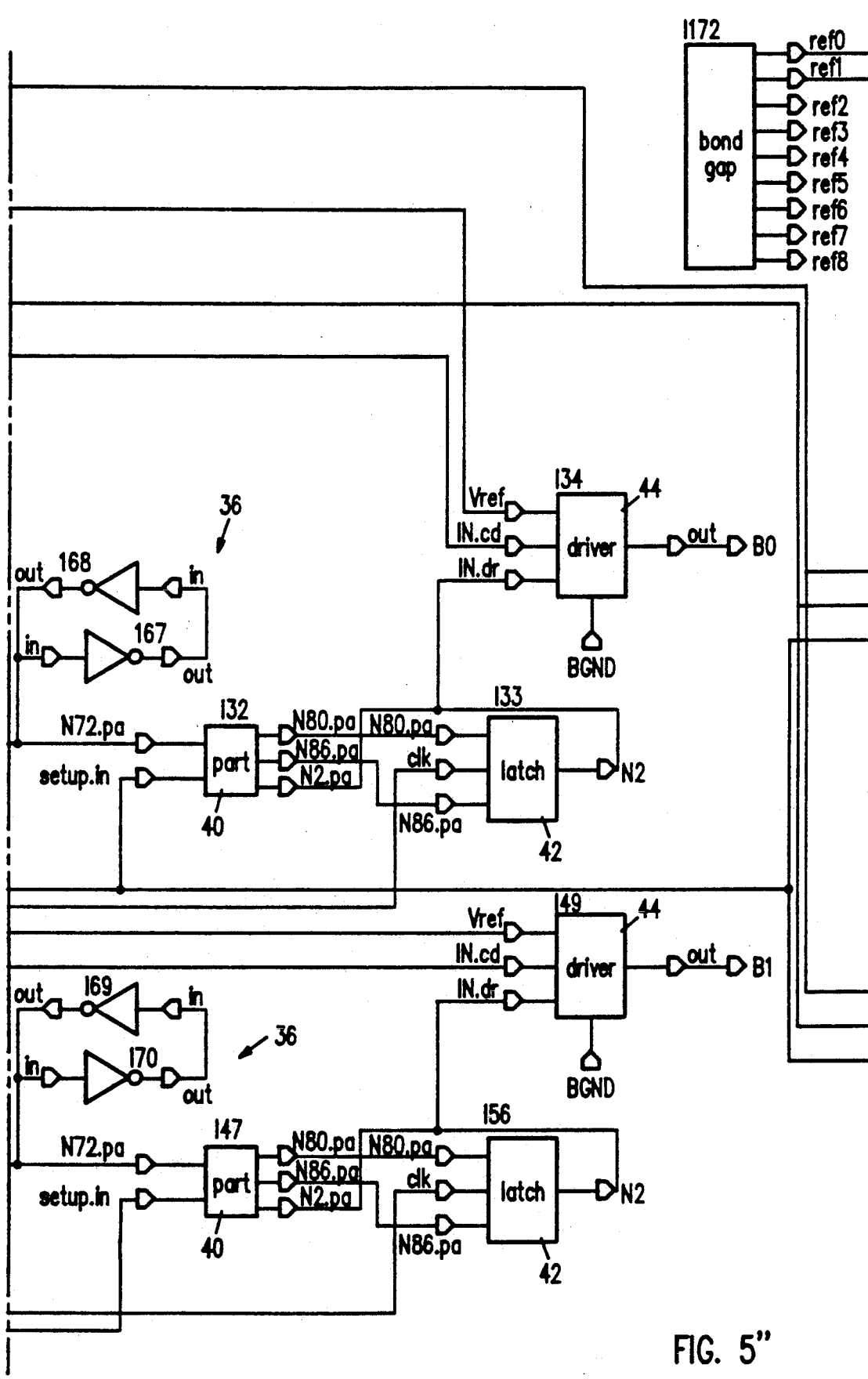
FIG. 5"

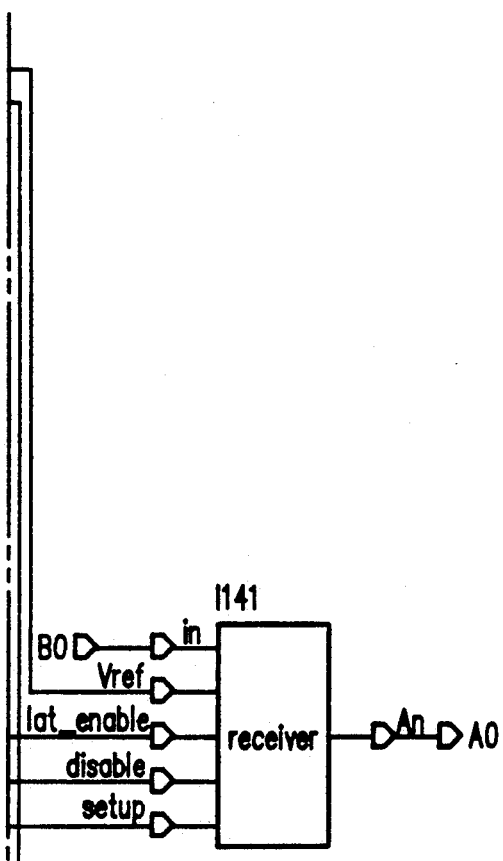
FIG. 5'''
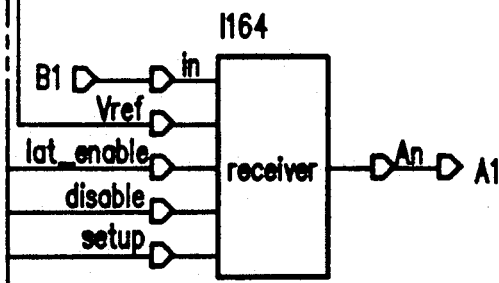
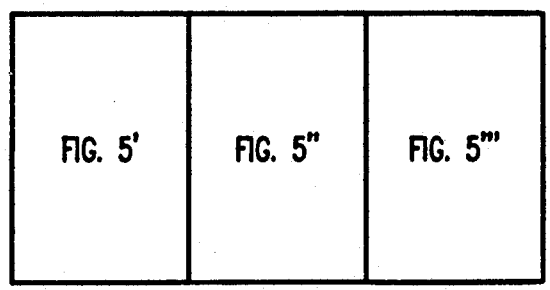
KEY TO FIG. 5

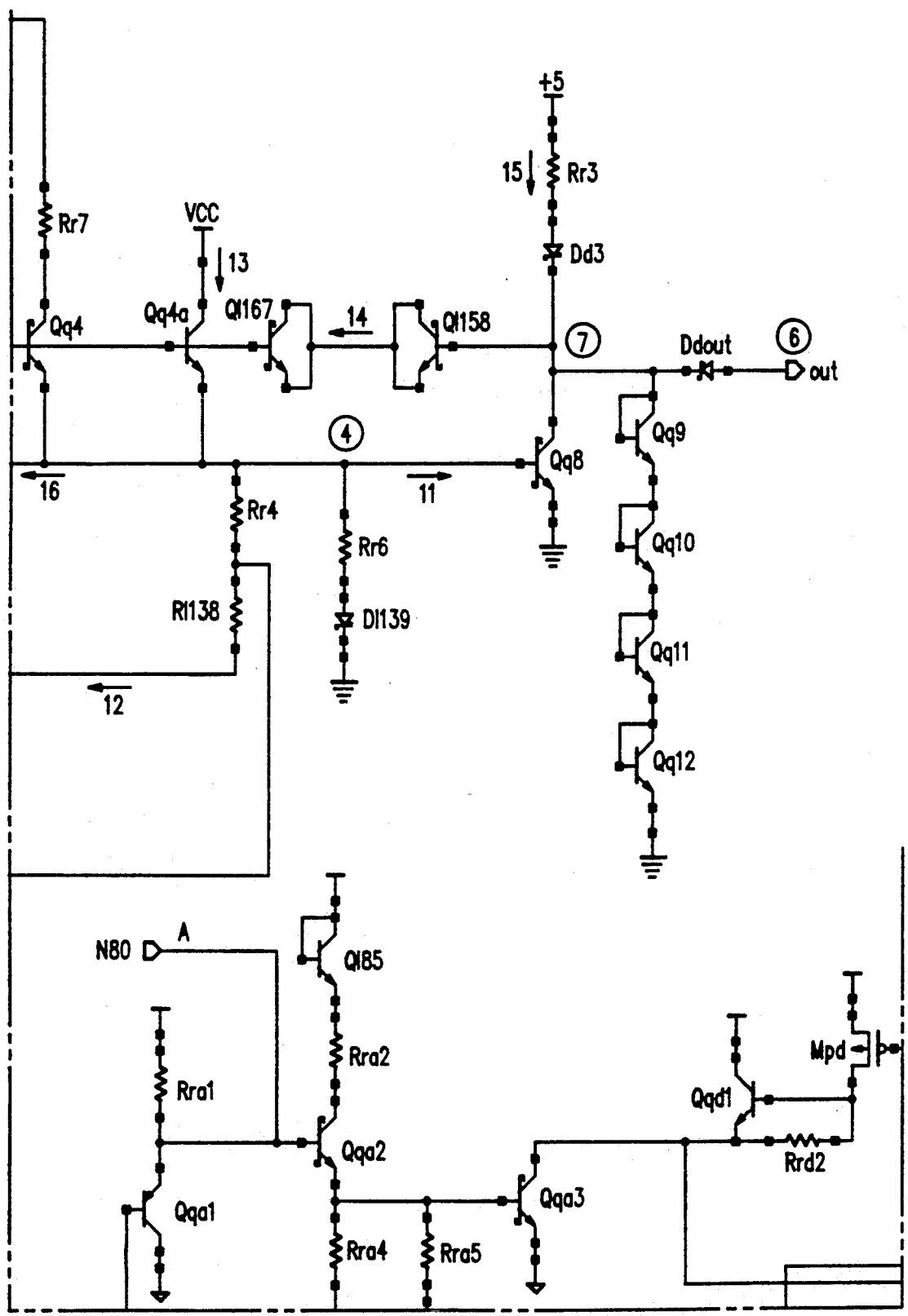
FIG. 7"

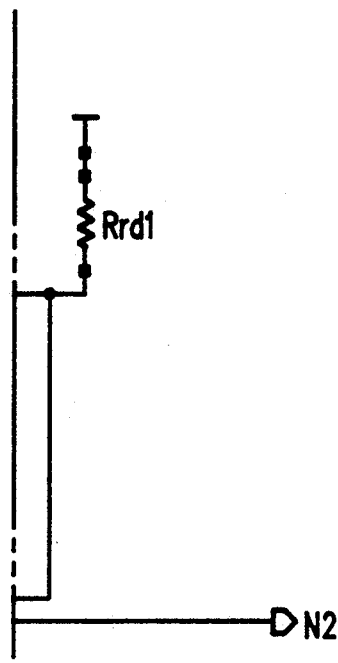
FIG. 7'''
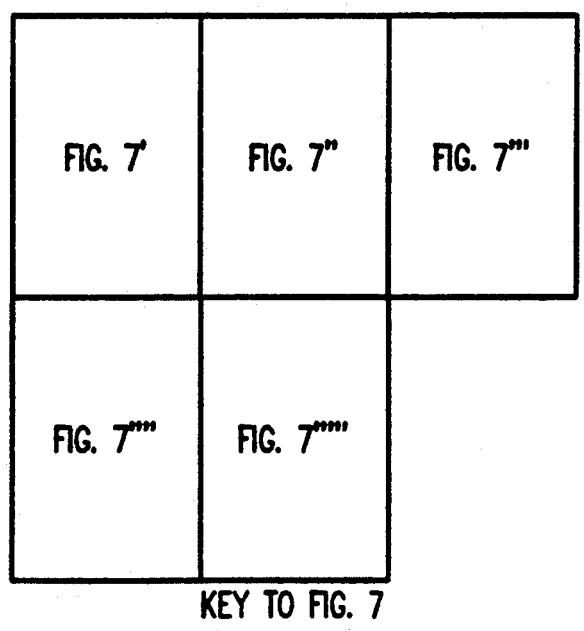
KEY TO FIG. 7

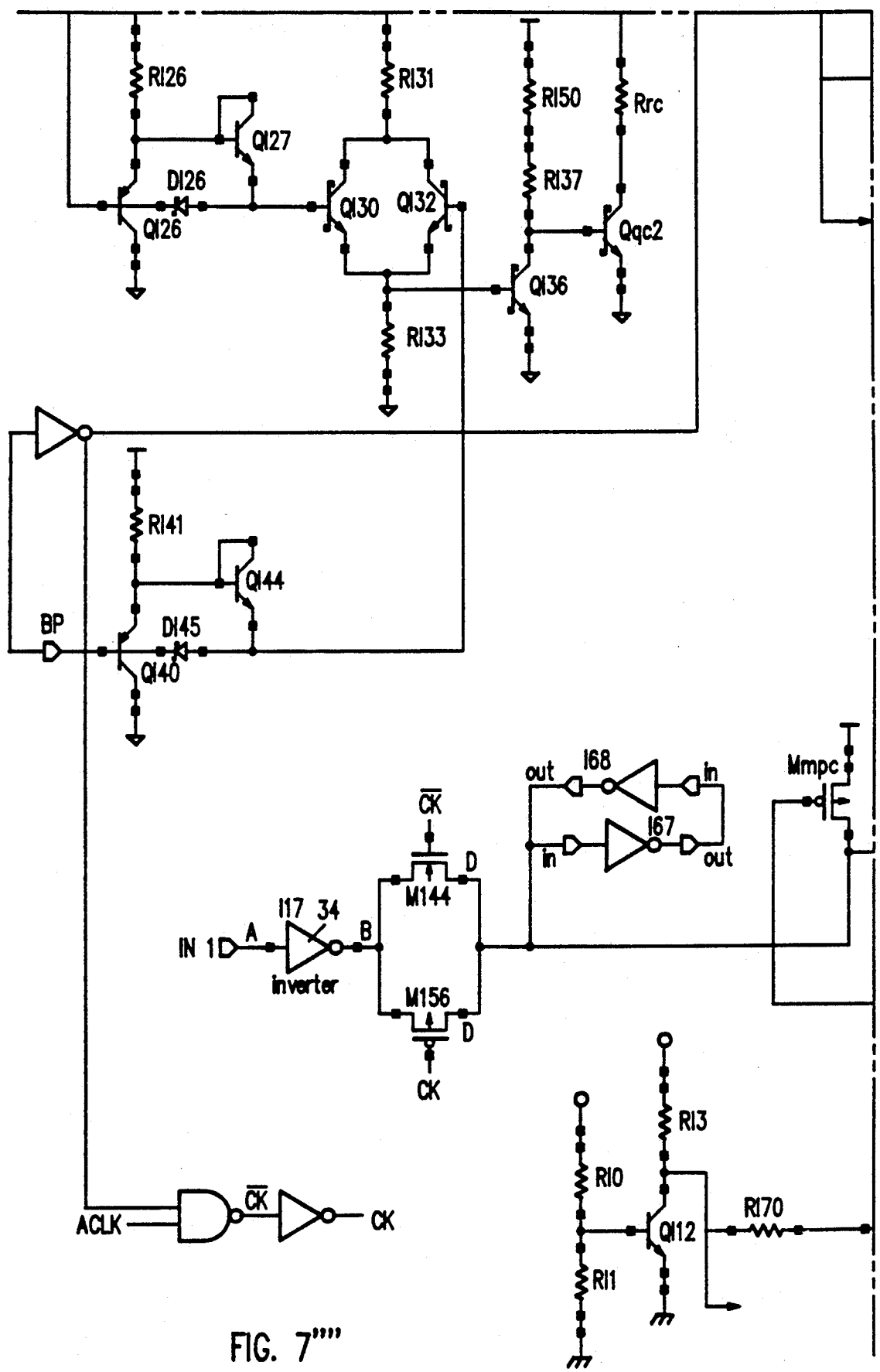
FIG. 7''''

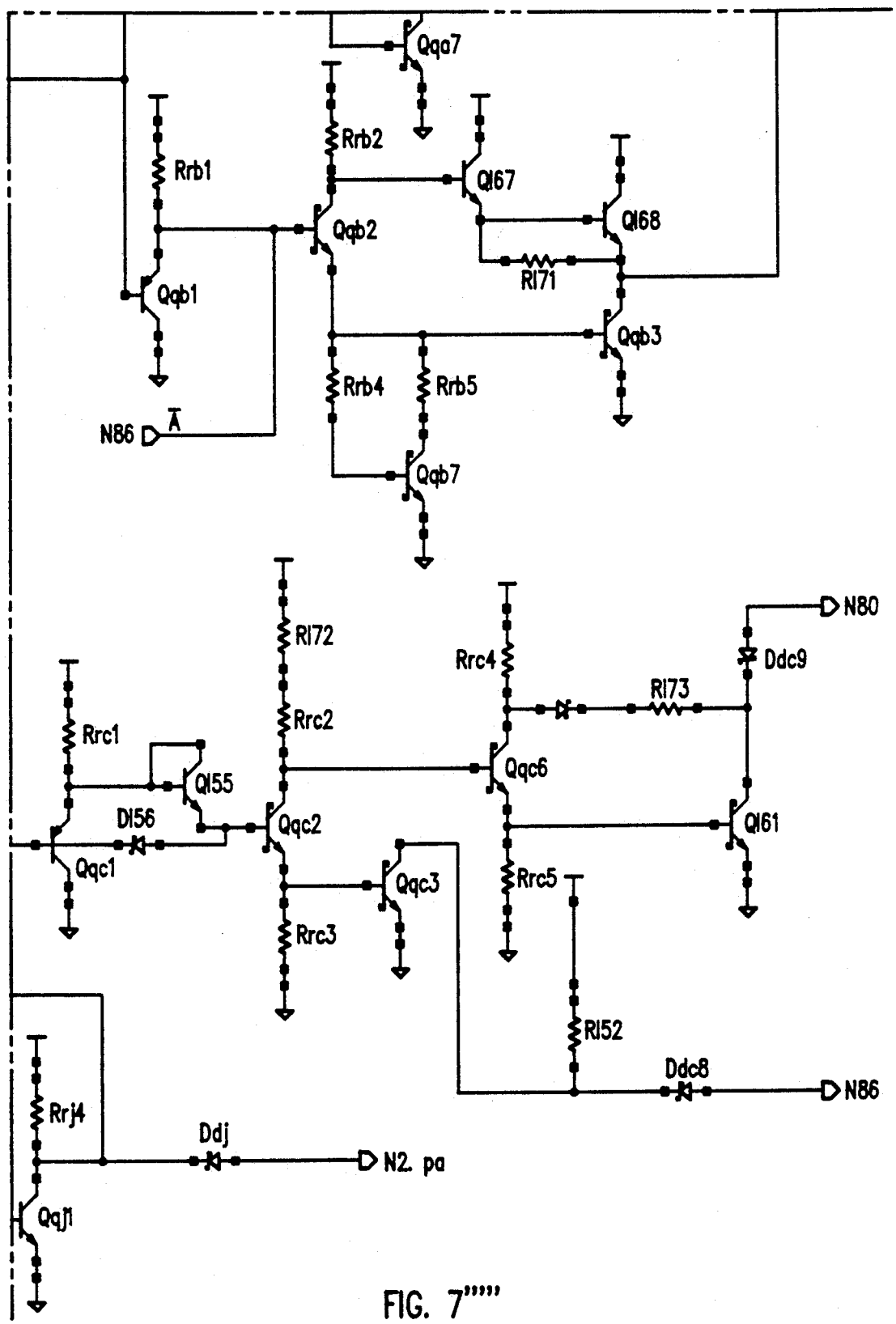
FIG. 7''''

HIGH SPEED, MASTER/SLAVE LATCH TRANSCEIVER HAVING A DIRECTLY-DRIVEN SLAVE STAGE

BACKGROUND OF THE INVENTION

1. Field of the Invention

The present invention relates to line interface devices and, in particular, to a high speed latch transceiver having a master stage driven by a clock signal received from an internal clock generator and a slave stage driven directly by an external clock input.

2. Discussion of the Prior Art

A data transceiver (TRANSmitter/reCEIVER) is a read/write terminal capable of transmitting imformation to and receiving information from a transmission medium. A transceiver typically includes a line driver stage and a receiver stage. The line driver amplifies digital signal outputs from a computer system so that the signals can be properly transmitted on the transmission medium. Conventional line drivers usually include level shifting capability to provide compatibility with different integrated circuit technologies (e.g., TTL) that might be used in the computer's internal logic. The receiver is typically a differential amplifier that receives signals from the transmission medium and provides an output representative of digital information received from the medium.

Transceiver circuits may be designed for general-purpose applications or may be designed for a more specific, industry standard data-communications configuration.

One such industry standard is the so-called IEEE 896.1 Futurebus+ standard. The Futurebus+ standard provides a protocol for implementing an internal computer bus architecture.

FIG. 1 shows the hierarchy of bus levels utilizable in a Futurebus+ system.

FIG. 2 shows the positioning of a data transceiver between the backplane bus of a Futurebus+ system and the data bus of a processor internal to that system to facilitate communications between the processor and the rest of the system.

FIG. 3 shows a conventional latching transceiver 10 utilizable in Futurebus+ applications. The latching transceiver 10 is, essentially, a master/slave edge-triggered flip-flop that includes an input buffer 12 that transfers input data A to a master latch 11 via a master CMOS transmission gate 16 when the clock CK is low. When clock signal CK goes high, data stored by the master latch 11 is transferred to a slave latch 18 via a slave CMOS transmission gate 20. Also when clock signal CK goes high, data stored by the slave latch 18 is provided at the output B of latch transceiver 10 via output driver stage 22.

The propagation delay $T_{pHL}$ of the latch transceiver 10 for a high to low transition of clock CK may be represented as follows:

$$T_{pHL} = 2T_G + 2T_G + t_{pHL}$$
$$= 4ns + 3ns$$
$$= 7ns$$

where the driver 22 high to low delay $t_{pHL}=3ns$.

The propagation delay $T_{pLH}$ for a low to high transition of clock CK may be represented as follows:

$$T_{pLH} = 2T_G + 2T_G + t_{pLH}$$
$$= 4ns + 4ns$$
$$= 8ns$$

where the driver 22 low to high delay $t_{pLH}=4ns$.

In both of the above cases, the gate propagation delay $T_G$ is taken to be 1ns. Of course, $T_G$ is process and device geometry dependent and will vary with changes in these parameters. The 1ns propagation delay represents a typical number for a given process. Under worst case conditions (e.g. ambient temperature $T_A=70°$, supply Vce=4.5V and sheet resistance=20%), the 1ns figure could double.

These propagation delays are unacceptably slow for Futurebus+ applications. Furthermore, the FIG. 3 transceiver design is overly temperature dependant, because the transmission gates work poorly when temperature increases.

SUMMARY OF THE INVENTION

A multi-bit latch transceiver in accordance with the present invention is designed to meet the IEEE 1194.1 standard for backplane transceiver logic as specified in the IEEE 896.2 Futurebus+ specification. The latch transceiver features support for live insertion, low skew, controlled rise/fall time (2ns-5ns) and glitch free power-up/down protection. The transceiver utilizes on-chip latches and a built-in bandgap reference that provides very accurate thresholds. Unique slave stage logic in the transceiver's driver stage provides preset input conditions to the slave latch such that data is instantly clocked to the driver output when the driver is enabled, thus reducing propagation delay. High speed operation is obtained because, while the master stage of the latch is driven by a clock signal received from an internal clock generator, the slave stage is driven directly by a separate, externally provided clock input.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

Figure 4:
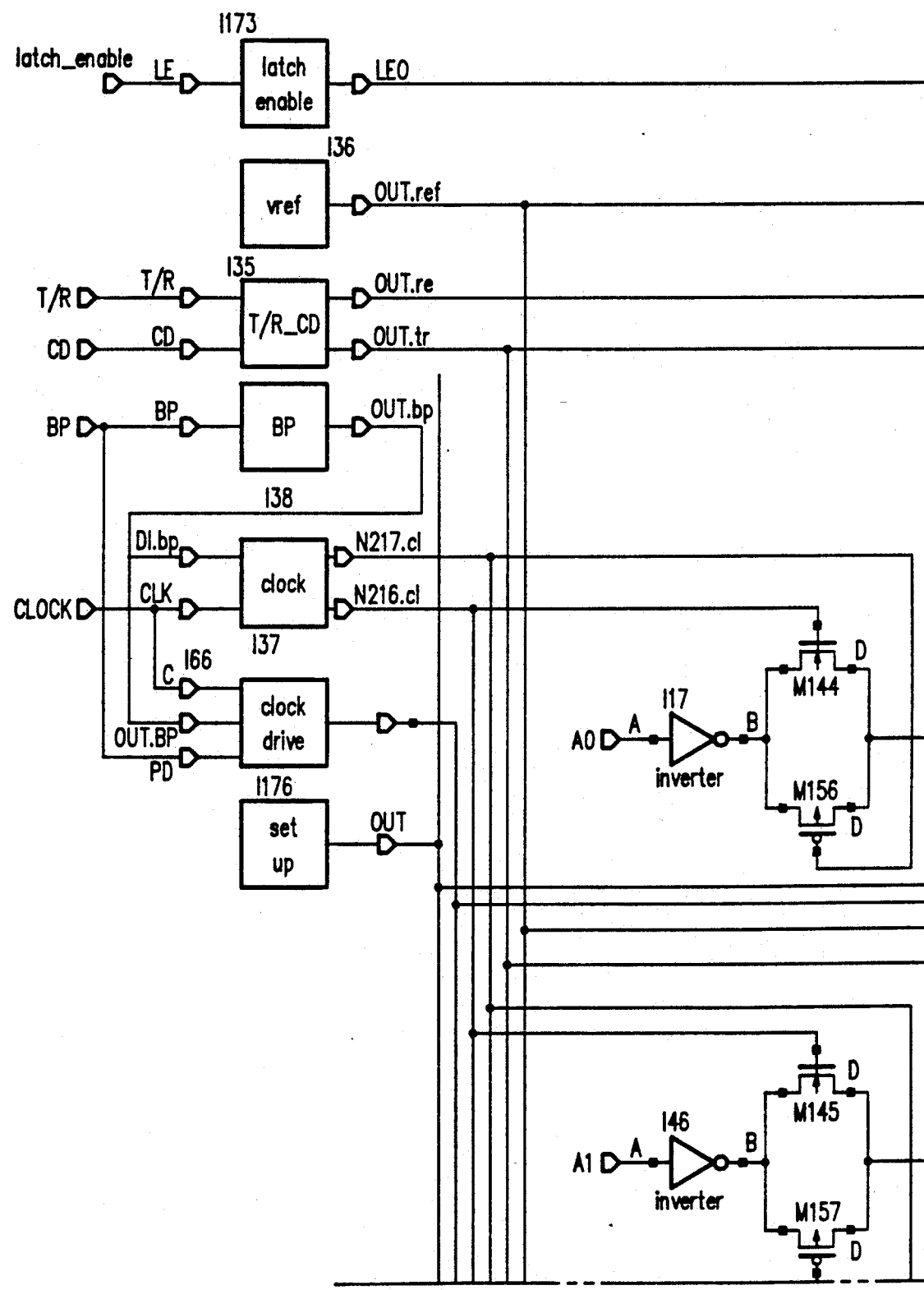
FIG. 4 is a block diagram illustrating a 9-bit latch transceiver in accordance with the present invention.
Figure 4:
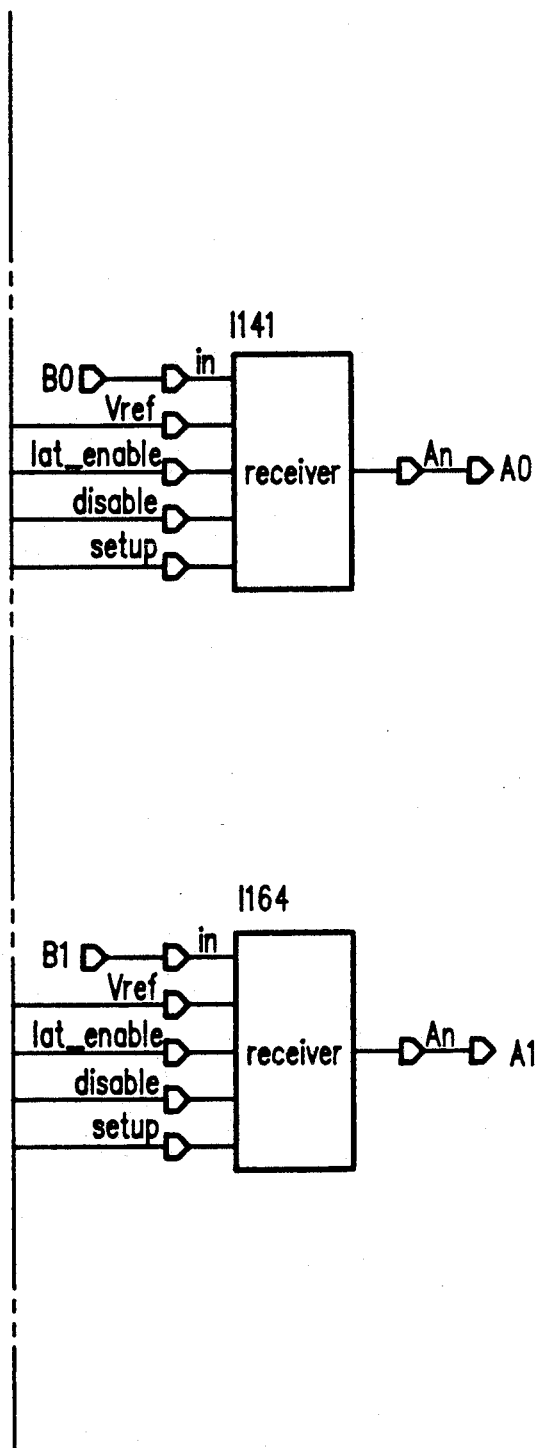

FIG. 4 shows a block diagram of a 9-bit latch transceiver 30 designed to conform to the IEEE1194.1 (BTL) standard as specified in the IEEE 896.2 (Futurebus+) standard. The latching transceiver 30 utilizes nine input channels A0–A8 to implement byte wide address/data with 1-bit parity.

Figure 5:
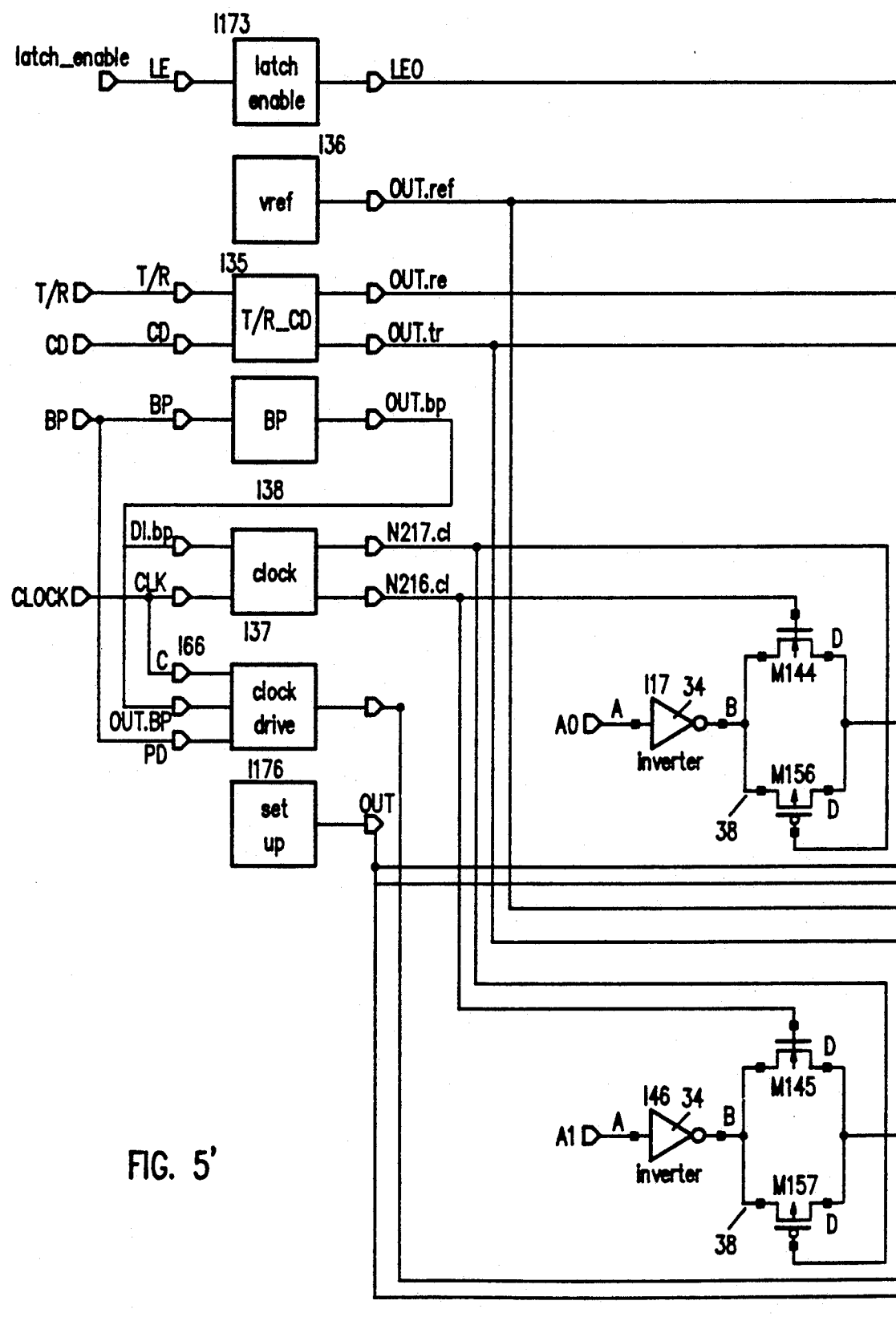
FIG. 5 is a block diagram illustrating the first two channels of the FIG. 4 latch transceiver in greater detail.

FIG. 5 shows input channels A0 and A1, which are representative of the design of the remaining channels A2–A8, in greater detail.

As shown in FIGS. 4 and 5, each channel of latch transceiver 30 includes a driver stage and a receiver. A transmit/receive control with chip enable (T/R$_{13}$CD) block enables and disables the drivers and receivers. A setup block insures that the driver and receiver outputs are glitch-free during power-up and power-down. A bandgap voltage reference block provides reference voltage inputs to all receivers. A voltage bias block (VREF) regulates base drive for each driver to achieve fast and stable propagation delay over varying operating conditions of supply and temperature.

Figure 1:
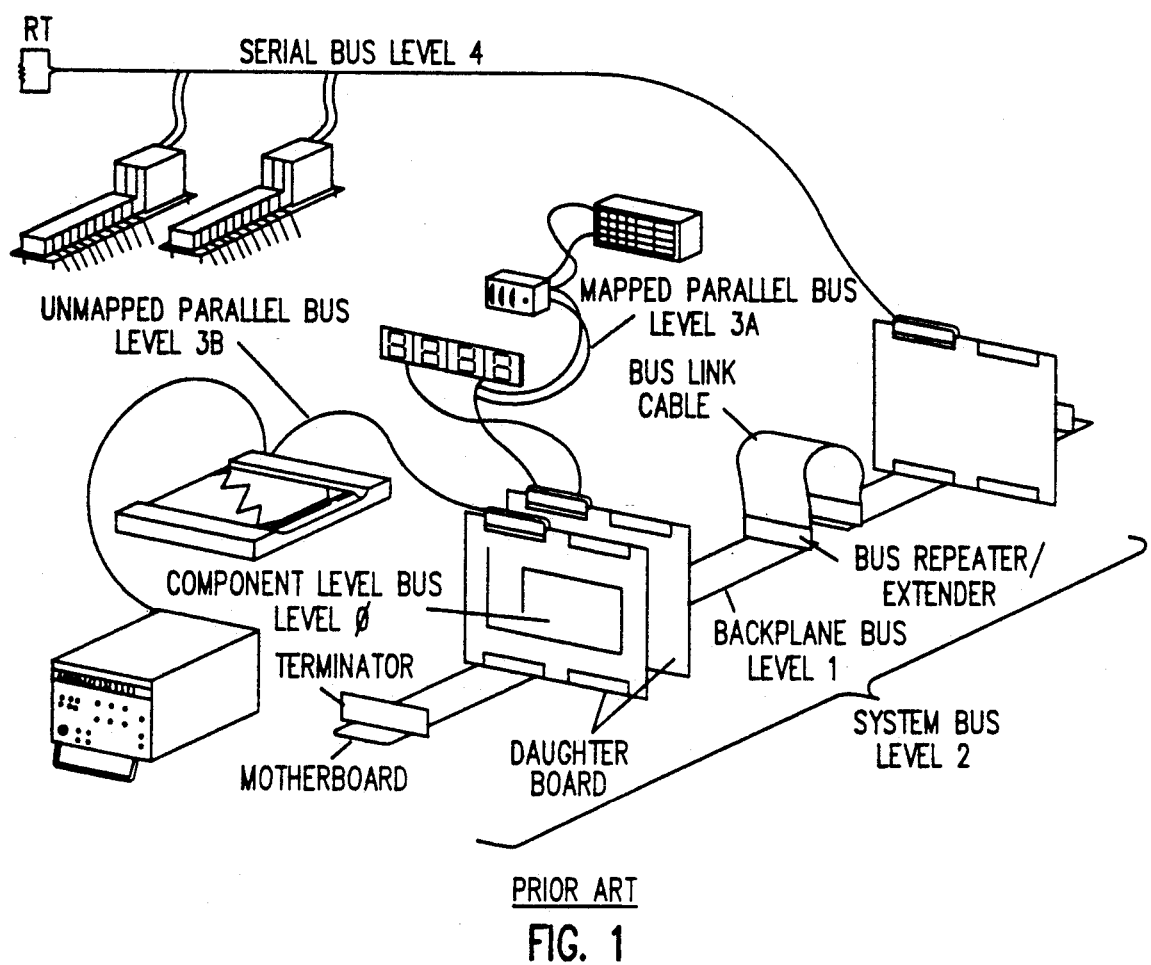
FIG. 1 is a pictorial illustration of the hierarchy of the bus levels in a Futurebus+ system architecture.
Figure 2:
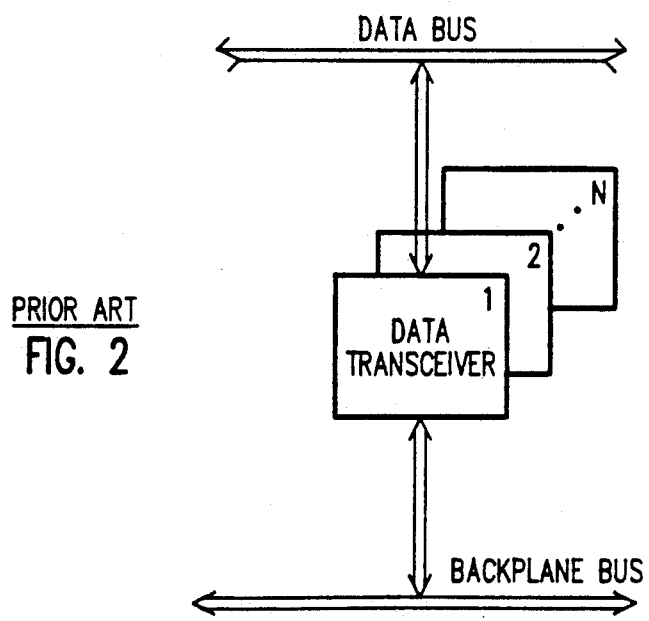
FIG. 2 is a simple block diagram illustrating the positioning of a high speed latch transceiver between a backplane bus of a Futurebus+ system and the data bus of a microprocessor internal to the Futurebus+ system.
Figure 3:
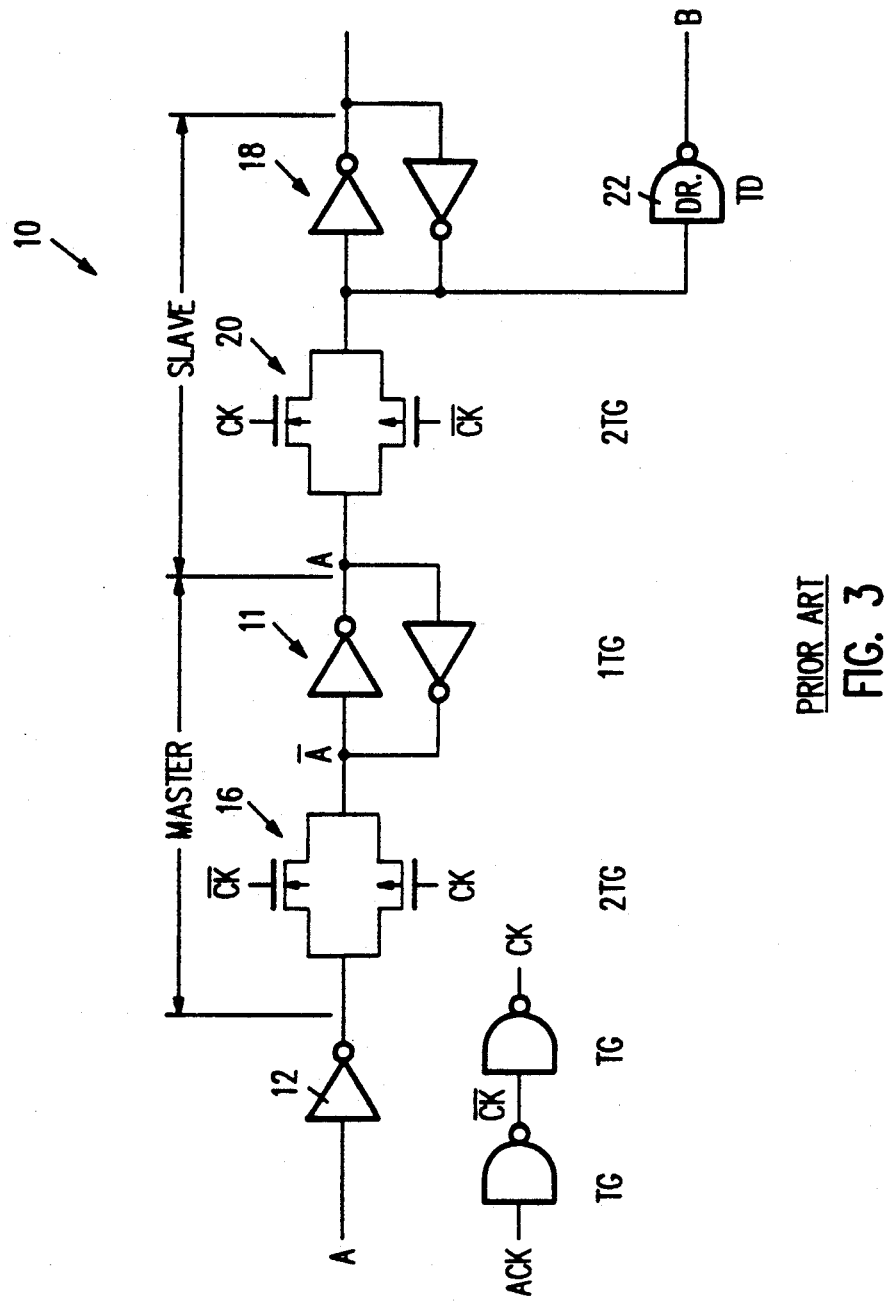
FIG. 3 is logic diagram illustrating a conventional latch transceiver utilizable in a Futurebus+ system.

Referring to FIG. 5, the "master" latch portion of the driver stage of latch transceiver 30 is similar to that of the conventional latch transceiver 10 shown in FIG. 3. That is, the master latch portion of driver stage includes an input buffer 34 that transfers input data A to a master latch 36 via a master CMOS transmission gate 38 when the clock signal CK is low.

However, in accordance with the present invention, the remainder of the driver stage of the latch transceiver 30 relies on an improved design completely different from that of conventional transceiver 10. More specifically, the conventional clock circuitry is replaced by a clock buffer that is tied to the input of the slave stage circuitry. The slave stage circuitry includes port 40, latch 42 and driver 44.

Figure 6:
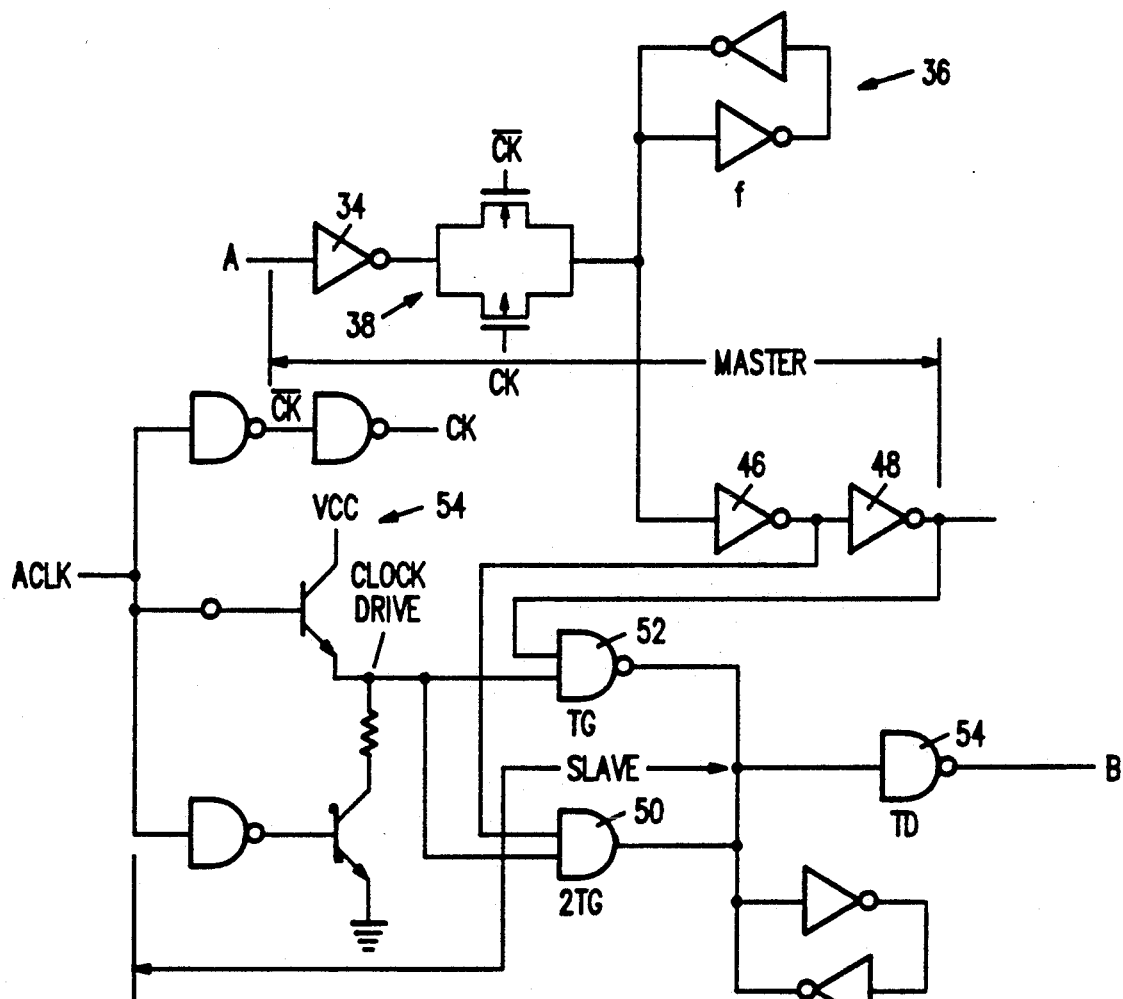
FIG. 6 is a logic diagram illustrating a high speed Futurebus+ latch transceiver in accordance with the present invention.

FIG. 6 shows the master-slave elements of latch transceiver 30 in a greater level of logic detail. As stated above, when the clock signal CK is low, input data A is stored to master latch 36 via input buffer 34 and master transmission gate 38.

As shown in FIG. 6, the master latch stage provides two stage outputs from inverters 46 and 48. The output of inverter 46 is provided to AND gate 50; the output of inverter 48 is provided to NAND gate 52. Both AND gate 50 and NAND gate 52 are also driven by an additional input from an emitter follower clock buffer 54.

Thus, based on the low to high transitions of the clock input ACLK to the buffer 54, data is transferred from the master latch to the driver output B via driver stage 56.

More specifically, when the externally provided signal ACLK is low, clock signal CK is also low ("CK bar", i.e. CK inverted, is high) and transmission gate 38 is turned on to transfer input data A to the master latch 36. At the same time, while clock signal ACLK is low, the CLOCK DRIVE input to the slave latch is off. Thus, there is a zero input to the slave stage and the slave latch is off.

When the clock signal ACLK is high, the master latch provides its signal to the slave latch inputs and the master transmission gate 38 is off. Meanwhile, CLOCK DRIVE provides an enable signal to either AND gate 50 or to NAND gate 52, depending on the logic state of the data received from the master latch via CMOS inverters 46 and 48, respectively.

The slave node is connected to the input of driver 56. When the slave node goes high, the output of driver 56 goes low at the output node B. If the data to the slave state is low, the output node B goes high.

Figure 7:
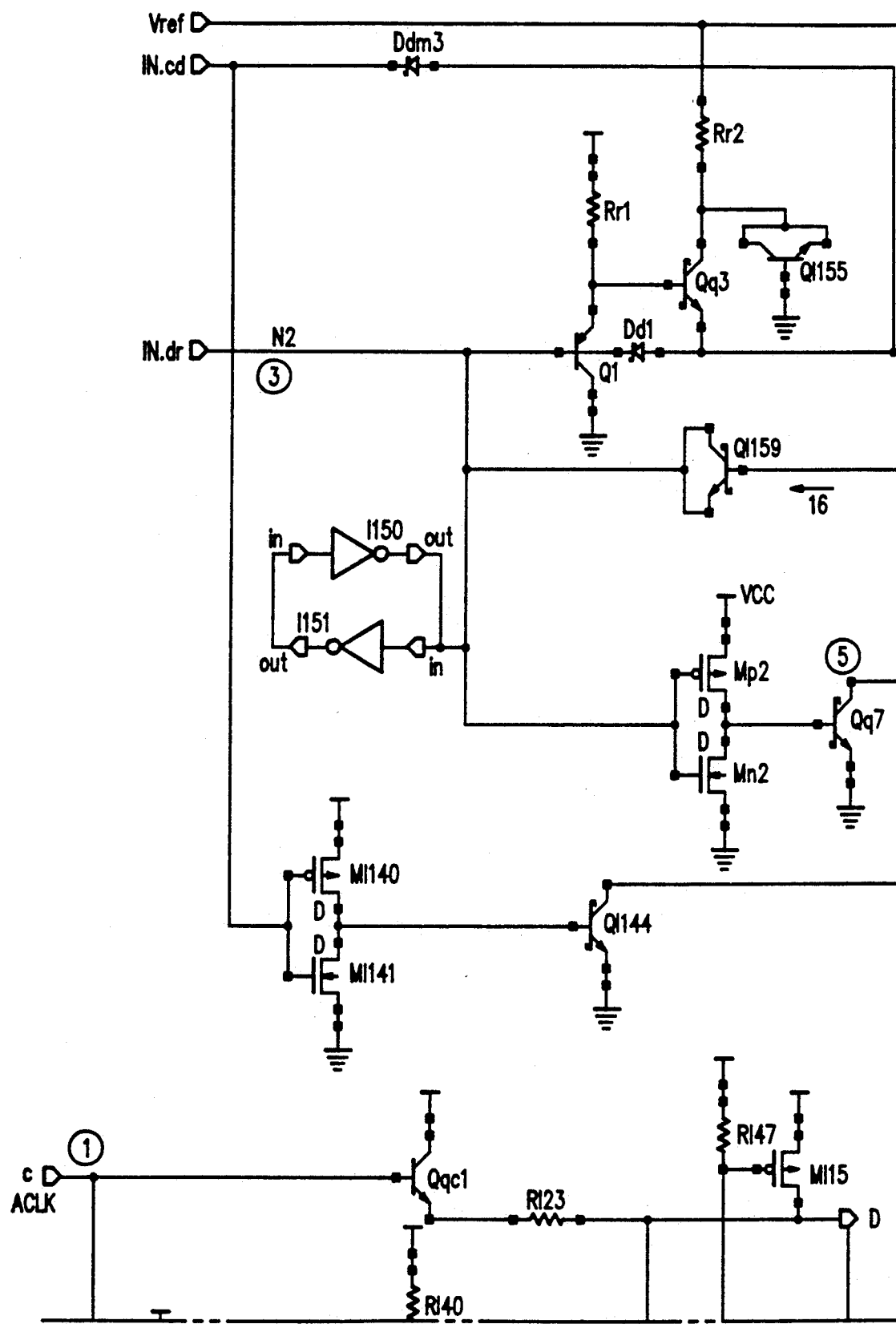
FIG. 7 is a schematic diagram illustrating a circuit embodiment of a latch transceiver in accordance with the present invention.

FIG. 7 provides a detailed schematic diagram of a circuit embodiment of a single channel latch transceiver 30 in accordance with the invention. As shown in FIG. 7, to achieve fast propagation delay, capacitor transistor Q159 provides instant "on" or "off" base drive current to output transistor $Q_q8$.

When the data input is high, "A" is high. A low to high clock signal of ACLK turns on gate 50 (FIG. 6). The turn-off of gate 50 also forces driver input N2 to the high state quickly by p-channel buffer transistor Mpd.

On the other hand, when the data input is low, "A bar" is high. A low to high transition of externally provided clock signal ACLK turns on gate 52 (FIG. 6). The turn-on of gate 52 output transistor Qqa3 also switches driver input N2 from high to low quickly.

When driver input N2 goes high, transistor capacitor Q159 provides instant base drive current to driver ouput transistor Qq8 for fast turn-on. Conversely, when driver input N2 goes from high to low, transistor capacitor Q159 provides instant discharging base current to output transistor Q159 to remove its storage charge. Thus, the driver output transistor Q159 can also be turned off very quickly.

The above-described architecture produces a high-to-low propagation delay as follows:

$$T_{pHL} = 2T_G + t_{pHL}$$
$$= 2ns + 3ns$$
$$= 5ns$$

The low-to-high propagation delay is as follows:

$$t_{pLH} = T_G + t_{pLH}$$
$$= 1ns + 4ns$$
$$= 5ns$$

Thus, the latch transceiver 30 generates symmetrical transitions and propagations delays that are significantly reduced from conventional designs.

A detailed schematic diagram of a circuit embodiment of a single channel latch transceiver 30 is provided in FIG. 7.

It should be understood that various alternatives to the embodiments of the invention described herein may be employed in practicing the invention. It is intended that the following claims define the scope of the invention and that methods and apparatus within the scope of these claims and their equivalents be covered thereby.

What is claimed is:

1. A latch transceiver comprising:
   a clock generator that responds to an input clock signal by providing both a first clock signal and a second clock signal that has an active state and an inactive state;
   a master latch stage that responds to a data input signal having first and second logic states and to the first clock signal by providing a master latch output signal;
   a slave latch stage that includes
   (i) NAND gate invertor logic coupled to receive the master latch output signal and responsive to the second clock signal in the active state for providing the master latch output signal to a slave stage logic output node if the data input is the first logic state; and (ii) AND gate non-invertor logic coupled to receive the master latch output signal and responsive to the second clock signal in the active state for providing the master latch output signal to the slave stage logic output node if the data input is the second logic state, and wherein both the NAND gate invertor logic and the AND gate non-invertor logic respond to the second clock signal in the inactive state by providing a high-impedance output signal at the slave stage logic output node; and a driver stage coupled to the slave stage logic output node and that responds to the master latch output signal at the slave stage logic output node when the second clock signal is in the active state by providing a corresponding latch transceiver output signal.

2. A latch transceiver as in claim 1 and wherein the clock generator includes a npn emitter follower transistor having its collector coupled to a supply voltage, its emitter coupled to provide the second clock signal and its base coupled to receive the input clock signal.

* * * * *